(12) United States Patent
de Haas

(10) Patent No.: US 9,331,865 B2
(45) Date of Patent: May 3, 2016

(54) COMPARATOR CIRCUIT

(71) Applicant: NXP B.V., Eindhoven (NL)

(72) Inventor: Clemens Gerhardus Johannes de Haas, Ewijk (NL)

(73) Assignee: NXP B.V., Eindhoven (NL)

( * ) Notice: Subject to any disclaimer, the term of this patent is extended or adjusted under 35 U.S.C. 154(b) by 364 days.

(21) Appl. No.: 14/095,036

(22) Filed: Dec. 3, 2013

(65) Prior Publication Data

US 2015/0156032 A1 Jun. 4, 2015

(51) Int. Cl.
| H04L 12/40 | (2006.01) |
| H04L 12/12 | (2006.01) |
| H03K 5/24 | (2006.01) |
| H03K 19/0185 | (2006.01) |

(52) U.S. Cl.
CPC ........ *H04L 12/40039* (2013.01); *H03K 5/2472* (2013.01); *H03K 19/018521* (2013.01); *H04L 12/12* (2013.01)

(58) Field of Classification Search
None
See application file for complete search history.

(56) References Cited

U.S. PATENT DOCUMENTS

| 4,965,469 | A | 10/1990 | Kondoh et al. |
| 6,573,752 | B1 * | 6/2003 | Killat ............... H03K 19/00315 326/63 |
| 6,839,013 | B1 | 1/2005 | Cummins et al. |
| 6,902,118 | B2 | 6/2005 | Shank et al. |
| 7,588,194 | B2 | 9/2009 | Shank et al. |
| 7,641,131 | B2 | 1/2010 | Shank et al. |
| 7,657,961 | B2 | 2/2010 | Shank et al. |
| 7,673,814 | B2 | 3/2010 | Shank et al. |
| 7,839,102 | B1 | 11/2010 | Rana et al. |
| 7,959,090 | B2 | 6/2011 | Shank et al. |
| 8,141,794 | B2 | 3/2012 | Shank et al. |
| 8,144,487 | B2 | 3/2012 | Djenguerian et al. |
| 8,529,830 | B2 | 9/2013 | Zhou et al. |
| 2003/0012040 | A1 | 1/2003 | Orita et al. |
| 2005/0033998 | A1 | 2/2005 | Honda et al. |
| 2010/0102140 | A1 | 4/2010 | Shank et al. |
| 2010/0109742 | A1 * | 5/2010 | Honda ........... H03K 19/018521 327/333 |
| 2012/0187897 | A1 | 7/2012 | Lenk et al. |

FOREIGN PATENT DOCUMENTS

JP 11-088134 A 3/1999

OTHER PUBLICATIONS

Extended European Search Report for EP Patent Appln. No. 14196140.9 (May 8, 2015).
TJA1145 Product Data Sheet, "High-Speed CAN Transceiver for Partial Networking", Rev. Sep. 1-27, 2013.

* cited by examiner

*Primary Examiner* — Long Nguyen
(74) *Attorney, Agent, or Firm* — Rajeev Madnawat

(57) ABSTRACT

Various aspects are directed to communications, as may be implemented in an automotive network. An input transistor has a gate coupled to an input port and to a voltage-limiting circuit, connected between the gate and a power rail. The voltage-limiting circuit presents a voltage to the gate corresponding to a voltage on the input port and less than the supply voltage level, and clamps a gate-source voltage of the transistor. In a power-saving mode, current is blocked on the current path when the input port is at the supply or ground voltage levels. When the input port transitions away from the threshold voltage, the apparatus transitions to a wake-up mode in which current is no longer blocked in the current path and in which a wake-up signal is provided based on the voltage at the input port and a bias voltage.

20 Claims, 3 Drawing Sheets

COMPARATOR CIRCUIT

Aspects of various embodiments are directed to comparator circuits, their implementation, and methods therefor.

A variety of comparator-type circuits are used for a multitude of applications. For instance, in some applications it is desirable to operate circuits in a low power mode during periods in which the circuits are not actively used or are lightly used, and further to switch such circuits to a high power mode for active/other applications. However, many such approaches can undesirably draw power in low power modes or otherwise. These types of circuits and their operation are sometimes referred to as wake-up circuits.

In some implementations, circuits are implemented in a manner that renders the circuits susceptible to undesirably high voltage or current. For instance, some power supplies such as battery supplies in vehicles are too high for certain types of circuits. Moreover, various approaches employing such power supplies can undesirably draw current. For example, a local interconnect network (LIN) and wake-up port inputs often employ a high-voltage comparator (e.g., 40V max) with a threshold that is half the supply voltage. Other systems employing a network such as a controller area network (CAN) or Flexray network exhibit similar challenges. Such circuits may consume quiescent current for each pin/connection, and the current may flow independently of voltage levels of an input pin.

These and other matters have presented challenges to the implementation of comparators for a variety of applications.

Various example embodiments are directed to comparator circuits and their implementation.

According to an example embodiment, an apparatus is implemented for use in an automotive network having a plurality of communication circuits and a battery that powers the communication circuits. A first circuit generates a bias voltage by dividing a supply voltage level provided on a power rail by the battery, relative to a ground voltage level provided on a ground rail. An input transistor is located on a current path coupled between the power rail and the ground rail, and has a gate coupled to an input port. A voltage-limiting circuit is connected between the gate and the power rail, and presents a voltage to the gate at a first voltage level that corresponds to a voltage level on the input port, and is less than the supply voltage level, and clamps a gate-source voltage of the transistor via the voltage level on the input port. The apparatus is responsive to an input signal received on the input port by operating in a power-saving mode and a wake-up mode. In the power-saving mode, current is blocked on the current path, and is based on a voltage level at the input port being equal to a threshold voltage level that corresponds to one of the supply voltage level and the ground voltage level. In response to the voltage level at the input port transitioning away from the threshold voltage level, the apparatus transitions from the power-saving mode to a wake-up mode in which current is no longer blocked in the current path. While in the wake-up mode, one of the plurality of communication circuits provides a wake-up signal based on the voltage level at the input port and the bias voltage.

A method as follows is for use in an automotive network having a plurality of communication circuits and a battery that powers the communication circuits. A bias voltage is generated by dividing a supply voltage level provided on a power rail by the battery, relative to a ground voltage level provided on a ground rail. On a current path coupled between the power rail and the ground rail and having an input transistor with a gate coupled to an input port, a voltage-limiting circuit that is connected between the gate and the power rail is used to present a voltage to the gate at a first voltage level corresponding to a voltage level on the input port, the first voltage level being less than the supply voltage level. A gate-source voltage of the transistor is clamped via the voltage level on the input port. In response to an input signal received on the input port, a power-saving mode is operated in which current is blocked on the current path, based on a voltage level at the input port being equal to a threshold voltage level that corresponds to one of the supply voltage level and the ground voltage level. In response to the voltage level at the input port transitioning away from the threshold voltage level, the apparatus transitions from the power-saving mode to a wake-up mode in which current is no longer blocked in the current path. While in the wake-up mode, one of the plurality of communication circuits is controlled by providing a wake-up signal based on the voltage level at the input port and the bias voltage.

Another embodiment is directed to an apparatus including a bias circuit and a communication circuit. The bias circuit generates a bias voltage by dividing a supply voltage level provided on a power rail by a battery, relative to a ground voltage level provided on a ground rail. The communication circuit provides an output indicative of a voltage level at an input port, and includes an input transistor and a voltage-limiting circuit. The input transistor is coupled between the power rail and the ground rail and has a gate coupled to the input port. The voltage-limiting circuit clamps a gate-source voltage of the transistor in response to voltage level on the input port by presenting a first voltage level to the gate. The first voltage level is drawn from the power rail and is less than the voltage level on the power rail. The apparatus operates in a power-saving mode in which current is blocked on a current path (including the transistor) between the power rail and the ground rail, based on a threshold voltage level being presented at the input port in which the threshold voltage corresponds to one of the supply voltage level and the ground voltage level. In response to the voltage level at the input port transitioning away from the threshold voltage level, the apparatus transitions from the power-saving mode to a wake-up mode in which current is no longer blocked in the current path and, while in the wake-up mode, provides a wake-up signal based on the voltage level at the input port and the bias voltage. In some implementations, the second circuit includes a current mirror circuit connected between the power rail and the ground rail and flows a current that mirrors current in the current path, using the bias voltage. A comparator circuit is connected between the power rail and the ground rail and provides the wake-up signal based on a comparison between the current flowing through the current mirror circuit and a current flowing through the comparator circuit.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
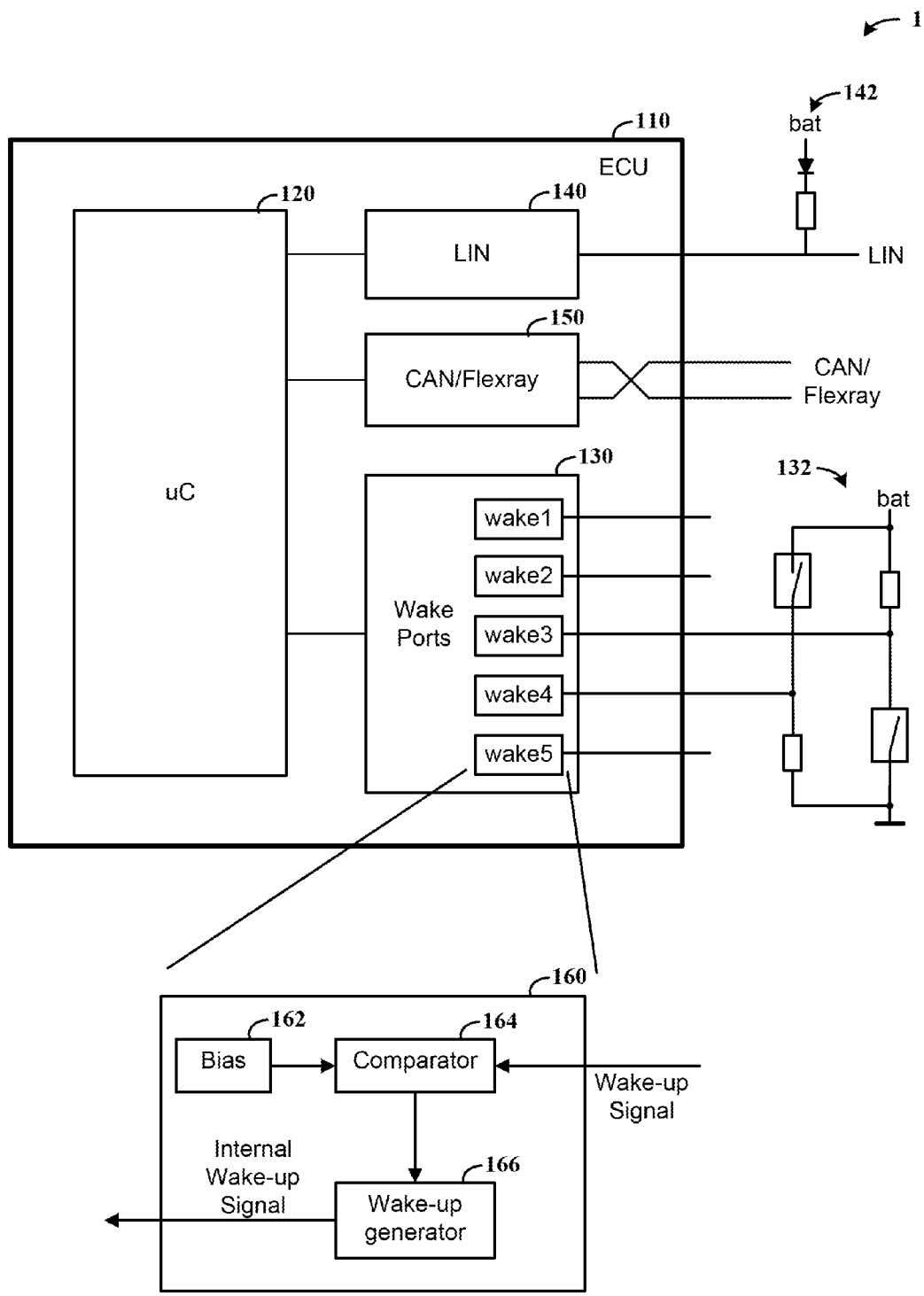
FIG. 1 shows an apparatus having wake-up functions, in accordance with an example embodiment.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving comparators, such as may be implemented in detecting conditions upon which a wake-up type event may be based. While not necessarily so limited, various aspects may be appreciated through a discussion of examples using this context.

Various example embodiments are directed to a comparator-type circuit useful for a variety of applications, such with vehicle-based communication networks. A biasing voltage is used to define a switching threshold at which current is passed for generating an output (e.g., a wake-up signal). The comparator-type circuit operates in a recessive state in which quiescent current is low or does not flow, and switches to an operating state based upon a voltage level at an input and the switching threshold. In this regard, a voltage presented at the input in the voltage domain can be translated to the current domain, with the bias voltage also translated to a signal in the current domain, and the wake-up signal can be provided based on a comparison of the first and second signals in the current domain.

The biasing voltage is generated in a variety of manners, to suit particular applications. For example, the biasing voltage can be generated using a resistive divider across a supply voltage. In some implementations, circuit consumption is lowered using relatively high ohmic resistors. Further, such a divider may be used for multiple comparators, such that adding a comparator does not increase quiescent current consumption.

One or more embodiments discussed herein may be implemented in automotive products in which quiescent current is desirably minimized, such as a wake-up detector for a local interconnect protocol (LIN) bus or a wake-input pin for other circuitry. Zero-current states can be achieved in the recessive state of such a LIN bus, or for a wake-input pin when configured to detect a negative edge or positive edge of a signal.

In another example embodiment, an apparatus operates in an automotive communication network powered by a battery, using a bias voltage generated using the battery. An input transistor has a gate coupled to an input port, and operates based on the voltage on the input port. A voltage-limiting circuit connected between the gate and a power rail presents a voltage to the gate that corresponds to a voltage level on the input port and is less than the supply voltage level, and clamps the gate-source voltage of the transistor. The apparatus operates in power-saving and wake-up modes as follows. The power-saving mode corresponds to a voltage level at the input port being equal to a threshold voltage level that corresponds to one of the supply voltage level and the ground voltage level (e.g., via connection to a negative terminal of the battery), in which current is blocked on a current path between the power rail and ground. When the voltage level at the input port transitions away from the threshold voltage level, the apparatus transitions from the power-saving mode to a wake-up mode in which current is no longer blocked in the current path, and provides a wake-up signal based on the voltage level at the input port and the bias voltage.

Various implementations are directed to the operation of devices, such as transistors, at a voltage level that is reduced from that provided via a battery used as a power supply (e.g., an automotive battery). This approach facilitates the use of manufacturing processes and circuits generally amenable to low-voltage applications, in higher-voltage applications, via limiting of voltage presented to sensitive circuits (e.g., transistors having gate oxide with maximum voltage levels lower than that of a supply voltage level). In one embodiment, the apparatus as described in the preceding paragraph includes an impedance circuit coupled to the input port and that provides such a low voltage level to one or more transistors, using the supply voltage level. In some implementations, one of the transistors has a gate coupled to the input port and passes current for generating the wake-up signal in response to the voltage level at the input port transitions. The impedance circuit provides the low voltage level by clamping a gate-source voltage of the first transistor (e.g., where a source of the transistor follows a voltage on the input port as the second circuit transitions from the power-saving mode to the wake-up mode).

In some implementations, the impedance circuit includes another transistor connected in series between the supply voltage and the transistor having its gate coupled to the input port, and a resistor connected in parallel across a source and a drain thereof. The other transistor clamps the gate-source voltage to a value based on the biasing voltage.

In a more particular embodiment, a comparator is connected to an output port as well as between the power and ground rails, with a reference voltage supply also being connected to the output port. The comparator provides the wake-up signal at the output in response to the current flowing in the current path, by passing current between the power rail and the ground rail and coupling the reference voltage supply to the ground rail.

Transitions between the power-saving mode and the wake-up mode are made in a variety of manners, depending upon the application. In some embodiments, the apparatus transitions back to the power-saving mode in response to the voltage level at the input port returning to the threshold voltage level after providing the wake-up signal. In another embodiment in which a static-type mode corresponds to the supply voltage level (e.g., is at the supply voltage level or at a level based on the supply voltage level), the apparatus operates in the power-saving mode when the voltage level at the input port corresponds to the supply voltage level, transitions from the power-saving mode to the wake-up mode in response to the voltage at the input port transitioning toward the ground voltage level, and transitions back to the power-saving mode in response to the voltage level at the input port returning toward the supply voltage level. In yet another embodiment, the apparatus operates in the power-saving mode when the voltage level at the input port corresponds to the ground voltage level, transitions from the power-saving mode to the wake-up mode in response to the voltage at the input port transitioning toward the supply voltage level, and transitions back to the power-saving mode in response to the voltage level at the input port returning to the ground voltage level.

Another embodiment is directed to a method implemented in an automotive network having a plurality of communication circuits and a battery that powers the communication circuits. A voltage is presented to a transistor gate coupled to an input port, using the supply voltage to provide a voltage level corresponding to a voltage level on the input port and less than the supply voltage level, and the gate-source voltage of the transistor is clamped. In response to an input signal received on the input port, current is blocked on the current path including the transistor in a power-saving mode, based on a voltage level at the input port being equal to a threshold voltage level that corresponds to one of the supply voltage level and the ground voltage level. In response to the voltage level at the input port transitioning away from the threshold voltage level, a wake-up mode is entered in which current is no longer blocked in the current path. While in the wake-up mode, wake-up signal is provided based on the voltage level at the input port and a bias voltage generated using the supply voltage, and used to control one or more of the communication circuits.

In some implementations, an impedance circuit connected to the input port provides the low voltage level, using the supply voltage, to facilitate operation of gate oxides with the transistor that operates at the low voltage level (e.g., with the gate oxide being susceptible to undesirable operation at higher voltage levels). In some implementations, the impedance circuit clamps the gate-source voltage of the transistor.

The wake-up signal and related power mode transitions are carried out using one or more of a variety of approaches. In some embodiments, the wake-up signal is provided at an output port of a comparator circuit connected between the power rail and the ground rail, by passing current between the power rail and the ground rail in response to the current flowing in the current path, and by coupling the reference voltage supply to the ground rail. In certain implementations, the power-saving mode is entered after providing the wake-up signal, in response to the voltage level at the input port returning to the threshold voltage level. In another embodiment, the power-saving mode is carried out when the voltage level at the input port corresponds to (e.g., is equal to or based on) the supply voltage level, and a transition from the power-saving mode to the wake-up mode is carried out in response to the voltage at the input port transitioning toward the ground voltage level. A transition back to the power-saving mode is carried out in response to the voltage level at the input port returning to the supply voltage level.

Turning now to the figures, FIG. 1 shows a communication apparatus 100 having wake-up functions, in accordance with one or more example embodiments. Various embodiments are directed to one or more aspects as shown in FIG. 1, with some embodiments directed to all of the components as shown. An ECU (Electronic Control Unit) 110 includes a microcontroller 120 and a plurality of inputs, including wake-up ports 130 (with five ports "wake1" through "wake5" shown by way of example), LIN port 140 and CAN/Flexray port 150. Such circuits may be presented with inputs from a LIN network via battery 142, a CAN/Flexray network or other connected network arrangement as shown at 132. The ECU 110 operates to detect signals on an input port using one or more power-saving approaches such as described above, in which little or no current (e.g., only leakage current) flows in such a power-saving mode while providing an output in a wake-up mode upon a transition on one of the input ports.

In a particular embodiment, wake-up and power-savings modes are carried out as shown using block 160. A bias generator 162 generates a bias voltage based upon a supply voltage, and provides the bias voltage to a comparator circuit 164 coupled to receive a wake-up signal on an input port. The comparator circuit 164 may, for example, be implemented using a transistor having its gate coupled to the input port, and a voltage-limiting circuit as described above to provide a limited voltage to the transistor. When the input port transitions, the comparator 164 starts to flow current which is compared to the bias voltage, and used with a wake-up generator 166 to provide an internal wake-up signal for the microcontroller 120. Other approaches are directed to providing wake-up signals to other circuit components, using block 160.

The apparatus 100 is implemented in a variety of applications, depending upon the implementation. In some embodiments, the ECU 110 operates in a low-power mode in which there is no signal activity, and transitions to a wake-up/active state when there is activity. In certain implementations involving the LIN port 140, a bus coupled to the port has a voltage about equal to the battery supply in a recessive state. When another LIN node is driving the bus voltage to ground, the ECU 110 detects this.

The wake-up ports at 130 operate in respective scenarios. When the port is switched to ground, the input pin has a voltage equal to the battery supply voltage (a recessive state), the ECU detects a wake-up signal when the switch is closed and the input pin is driven to ground level. When the port is switched to a battery level, the input pin has a voltage level of 0V (a recessive state) and the ECU detects a wake-up signal when is switch is closed and the input pin is driven to battery level. In certain implementations, such approaches are implemented as shown in FIGS. 2 and 3, respectively, for an input voltage at battery and an input voltage at ground/reference level, and as may be carried out in the following discussion.

Figure 2:
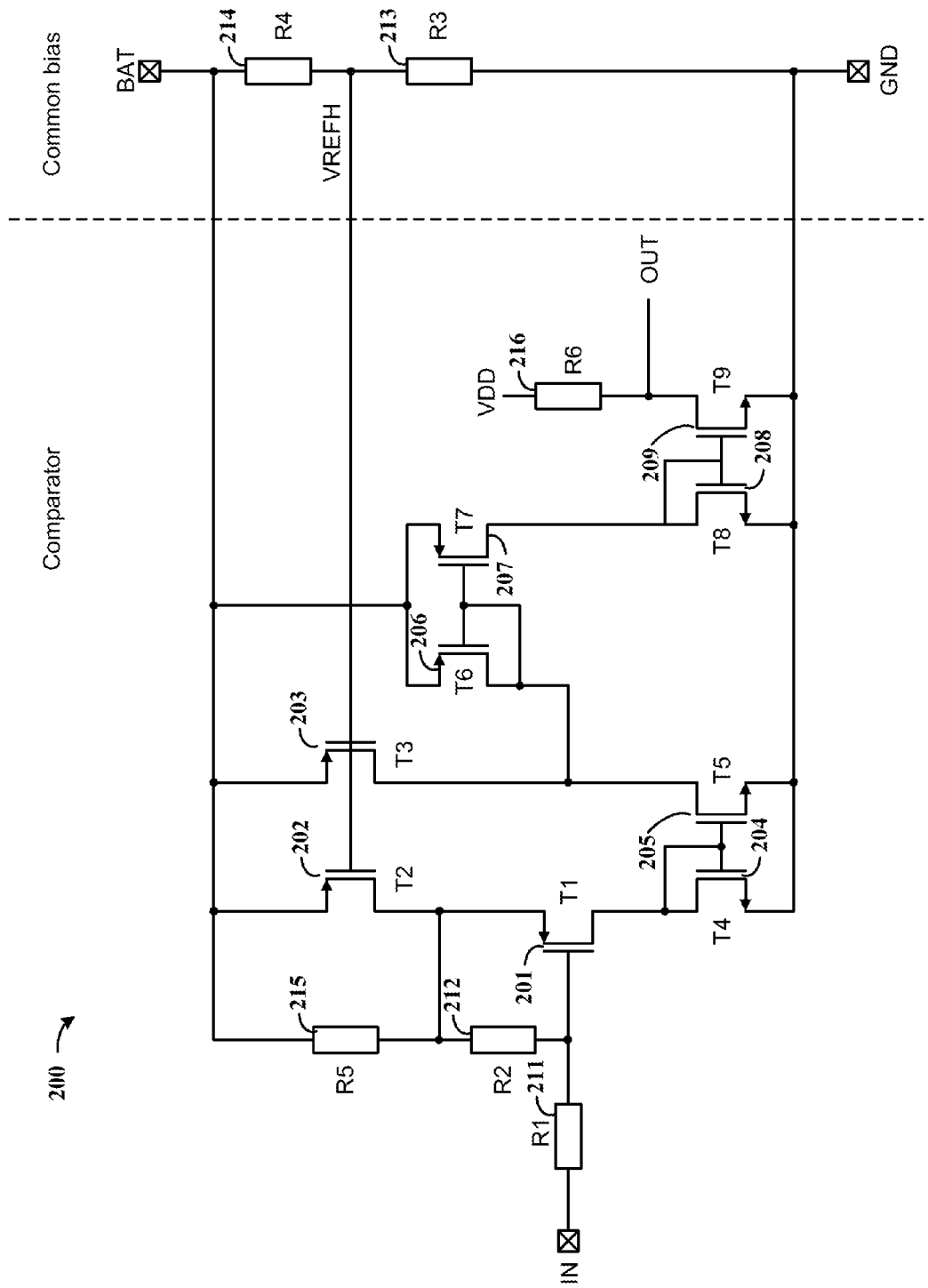
FIG. 2 shows an apparatus that generates a wake-up signal based on a supply voltage, in accordance with another example embodiment.
Figure 3:
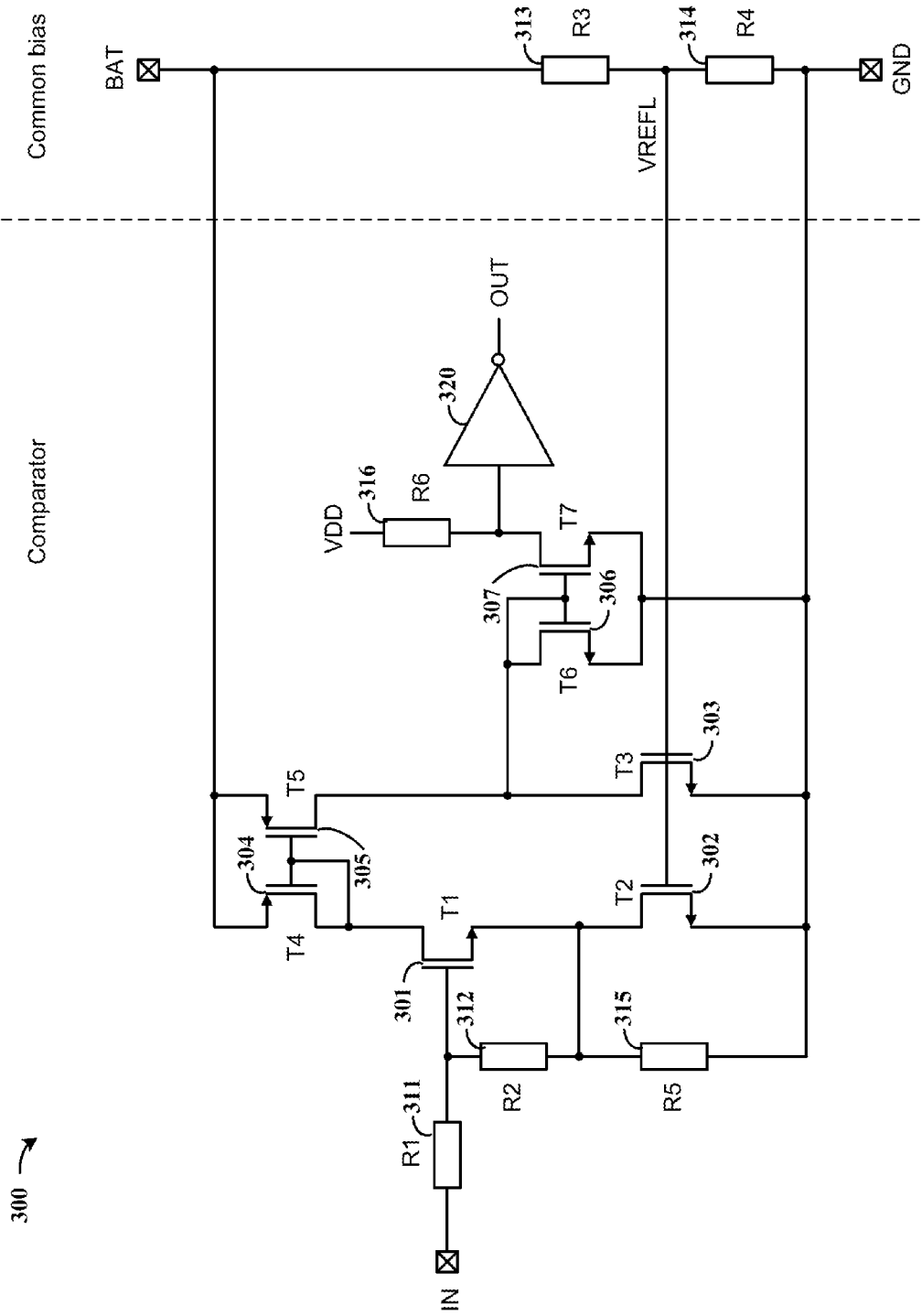
FIG. 3 shows an apparatus that generates a wake-up signal based upon a reference voltage, in accordance with another example embodiment.

FIG. 2 shows an apparatus 200 that generates a wake-up signal based on a supply voltage, in accordance with another example embodiment. A bias circuit includes respective resistors 213 and 214 (R3/R4) coupled between a power and ground rail (between a battery and ground), and provides bias voltage $V_{VREFH}$ corresponding to the resistors. A comparator circuit includes a transistor 201 (T1) having its gate coupled to an input port, as shown via an impedance circuit including resistors 211, 212 and 215 (R1, R2, R5) and operates to limit a voltage provided to the transistor at a switching threshold set via the bias circuit. Additional transistors 202-209 (T2-T9) are coupled as shown, and an additional resistor 216 (R6) is coupled between a VDD input and an output port to which transistor 209 is also coupled (e.g., with transistors 208/209 performing a level shift relative to VDD). In some embodiments, multiple such comparator circuits are implemented (e.g., for different input ports as shown in FIG. 1), which may share a common bias circuit.

The comparator circuit in FIG. 2 operates at about zero current in a recessive/power-saving state when the input voltage on the input pin ($V_{IN}$) is about equal to the battery supply voltage ($V_{BAT}$). When the input voltage equals the battery supply voltage, current through the transistors is zero and the output voltage (OUT) is about equal to VDD. When the input voltage transitions lower (toward GND from $V_{BAT}$), current starts to flow in transistors 201-205. The input voltage at which current will start to flow in transistors 206-209 is defined by:

$$I1 = \frac{\beta \cdot W1}{L1} \cdot \left(\left(\frac{(V_{S1} - V_{IN}) \cdot R2}{R1 + R2}\right) - VT\right)^2;$$

$$I2 = \frac{\beta \cdot W2}{L2} \cdot \left(\left(\frac{V_{BAT} \cdot R4}{R3 + R4}\right) - VT\right)^2,$$

$W1 = W2; L1 = L2; V_{S1} = V_{BAT}$ if $I2 \geq I1;$ $$\alpha 1 = \frac{R4}{R3 + R4}; \alpha 2 = \frac{R2}{R1 + R2}; \alpha 2 = \frac{\alpha 1}{2}$$

$I1 = I2; (V_{BAT} - V_{IN}) \cdot \alpha 2 = V_{BAT} \cdot \alpha 1;$ and $$V_{IN} = \frac{V_{BAT}}{2}$$

The ratio of resistors 205 and 206 determines the gain of the comparator circuit.

$$\frac{V_{BAT} - V_{threshold} - V_{IN}}{R5} \cdot R6 = V_{VDD};$$

$$\frac{V_{BAT} - V_{threshold} - (V_{threshold} - \Delta V_{IN})}{R5} \cdot R6 = V_{VDD};$$

$$V_{threshold} = \frac{V_{BAT}}{2};$$

$$\frac{V_{BAT} - 2 \cdot V_{threshold} + \Delta V_{IN}}{R5} \cdot R6 = V_{OUT};$$

$$\text{gain} = \frac{V_{OUT}}{\Delta V_{IN}} = \frac{R6}{R5}$$

Resistor 216 can be set higher than resistor 215, setting the switching threshold at $V_{IN}=V_{BAT}/2$. The ratios $\alpha 1$ and $\alpha 2$ are set according to a maximum battery supply voltage and a maximum allowable (or desirable) gate-source voltage of the transistors (e.g., as based upon a safe operating voltage).

$$V_{GSmax} = V_{BATmax} \cdot \alpha 1$$

Transistor 202 is used to protect the gate-source voltage of transistor 201. For instance, if the source of transistor 210 is connected to the BAT pin, the maximum gate-source voltage would be reached at $V_{IN}=V_{BAT}/2$. Transistor 202 operates with resistor 215 to clamp the gate-source voltage of transistor 201 at $V_{GSmax}$ when $V_{IN}<V_{BAT}/2$, because the voltage on the source of transistor 201 follows $V_{IN}$ below the switching threshold.

FIG. 3 shows an apparatus 300 that generates a wake-up signal based upon a reference voltage, in accordance with another example embodiment. The apparatus in FIG. 3 is similar to that shown in FIG. 2, with operation based upon an input voltage that is at the reference voltage level in a low-power state (e.g., a recessive state when $V_{IN}=0V$), and transitions to a wake-up state when the voltage at the input port moves toward the supply voltage level. Current consumption is about zero when $V_{IN}=0V$, and an inverter 320 is coupled to VDD via resistor 316 (R6) and used to provide a phase correction. A bias voltage VREFL is provided using resistors 313 and 314 (R3 and R4), and in some implementations, is provided together with VREFH as shown in FIG. 2 with two or more comparators using the common bias generation (e.g., with comparators 200 and 300 implemented with different input ports of a common apparatus). The apparatus 300 also includes transistor 301 (T1) having its gate coupled to the input port via an impedance circuit including resistors 311, 312 and 315 (R1, R2 and R5). Transistors 302-307 (T2-T7) are also provided as shown.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., generating a wake-up signal, generating a biasing current, or generating a mirrored current). For example, in certain of the above-discussed embodiments, one or more modules are discrete logic circuits or programmable logic circuits configured and arranged for implementing these operations/activities, as in the circuit modules shown in FIG. 1. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, different voltage levels may be implemented as levels at which no current flows (e.g., except leakage). Further, various embodiments may involve combinations of approaches in which input levels may be static at two or more different states, with transitions from those states being detected, such as by combining aspects as described in FIGS. 2 and 3. Such modifications do not depart from the true spirit and scope of various aspects of the invention, including aspects set forth in the claims.

What is claimed is:

1. For use in an automotive network having a plurality of communication circuits and a battery that powers the communication circuits, an apparatus comprising
    a first circuit configured and arranged to generate a bias voltage by dividing a supply voltage level provided on a power rail by the battery, relative to a ground voltage level provided on a ground rail; and
    a second circuit having
        a current path coupled between the power rail and the ground rail, having an input transistor with a gate coupled to an input port, and
        a voltage-limiting circuit connected between the gate and the power rail and configured and arranged to present a voltage to the gate at a first voltage level corresponding to a voltage level on the input port, the first voltage level being less than the supply voltage level, and to clamp a gate-source voltage of the transistor via the voltage level on the input port,
        the second circuit being configured and arranged to operate in response to an input signal received on the input port by:
            operating in a power-saving mode in which current is blocked on the current path, based on a voltage level at the input port being equal to a threshold voltage level that corresponds to one of the supply voltage level and the ground voltage level, and
            in response to the voltage level at the input port transitioning away from the threshold voltage level, transitioning from the power-saving mode to a wake-up mode in which current is no longer blocked in the current path, and while in the wake-up mode, controlling one of the plurality of communication circuits by providing a wake-up signal based on the voltage level at the input port and the bias voltage.
2. The apparatus of claim 1, wherein the second circuit includes at least one transistor having a gate oxide operable at a low voltage level that is less than the supply voltage level, further including an impedance circuit coupled to the input port and configured and arranged to provide the low voltage level to the at least one transistor, using the supply voltage level.

3. The apparatus of claim 2, wherein the at least one transistor includes a first transistor having a gate coupled to the input port and configured and arranged to pass current for generating the wake-up signal in response to the transitioning of the voltage level at the input port, wherein the impedance circuit is configured and arranged to provide the low voltage level by clamping a gate-source voltage of the first transistor.

4. The apparatus of claim 3, wherein first transistor has a source configured and arranged to follow a voltage on the input port as the second circuit transitions from the power-saving mode to the wake-up mode.

5. The apparatus of claim 2, wherein
the at least one transistor includes a first transistor having a gate coupled to the input port and configured and arranged to pass current for generating the wake-up signal in response to the transitioning of the voltage level at the input port, and
the impedance circuit includes a second transistor connected in series between the supply voltage and the first transistor, and a resistor connected in parallel across a source and a drain of the second transistor, the second transistor and resistor being configured and arranged to clamp the gate-source voltage to a value based on the biasing voltage.

6. The apparatus of claim 1, wherein the second circuit includes a comparator circuit connected to an output port and connected between the power rail and the ground rail, further including a reference voltage supply circuit connected to the output port, the comparator circuit being and configured and arranged to provide the wake-up signal at the output port by, in response to the current flowing in the current path, passing current between the power rail and the ground rail and coupling the reference voltage supply to the ground rail.

7. The apparatus of claim 1, wherein the ground rail is configured and arranged to provide the ground voltage level via connection to a negative terminal of the battery.

8. The apparatus of claim 1, wherein the second circuit is configured and arranged to, after providing the wake-up signal, transition back to the power-saving mode in response to the voltage level at the input port returning to the threshold voltage level.

9. The apparatus of claim 1, wherein the second circuit is configured and arranged to:
operate in the power-saving mode when the voltage level at the input port corresponds to the supply voltage level,
transition from the power-saving mode to the wake-up mode in response to the voltage at the input port transitioning toward the ground voltage level, and
transition back to the power-saving mode in response to the voltage level at the input port transitioning back toward the supply voltage level.

10. The apparatus of claim 1, wherein the second circuit is configured and arranged to:
operate in the power-saving mode when the voltage level at the input port corresponds to the ground voltage level,
transition from the power-saving mode to the wake-up mode in response to the voltage at the input port transitioning toward the supply voltage level, and
transition back to the power-saving mode in response to the voltage level at the input port transitioning back toward the ground voltage level.

11. The apparatus of claim 1, wherein the second circuit is configured and arranged to translate the input signal from a voltage domain to a first signal in a current domain, and to translate the bias voltage to a second signal in the current domain, and to provide the wake-up signal based on a comparison of the first and second signals in the current domain.

12. The apparatus of claim 1, wherein the voltage-limiting circuit is configured and arranged to present the first voltage level to the gate at a level that is reduced from the supply voltage level, based upon a maximum voltage level rating of a gate oxide of the transistor.

13. For use in an automotive network having a plurality of communication circuits and a battery that powers the communication circuits, a method comprising
generating a bias voltage by dividing a supply voltage level provided on a power rail by the battery, relative to a ground voltage level provided on a ground rail;
on a current path coupled between the power rail and the ground rail and having an input transistor with a gate coupled to an input port, using a voltage-limiting circuit connected between the gate and the power rail to
present a voltage to the gate at a first voltage level corresponding to a voltage level on the input port, the first voltage level being less than the supply voltage level, and
clamp a gate-source voltage of the transistor via the voltage level on the input port;
in response to an input signal received on the input port, operating in a power-saving mode in which current is blocked on the current path, based on a voltage level at the input port being equal to a threshold voltage level that corresponds to one of the supply voltage level and the ground voltage level, and
in response to the voltage level at the input port transitioning away from the threshold voltage level, transitioning from the power-saving mode to a wake-up mode in which current is no longer blocked in the current path, and while in the wake-up mode, controlling one of the plurality of communication circuits by providing a wake-up signal based on the voltage level at the input port and the bias voltage.

14. The method of claim 13, further including using an impedance circuit coupled to the input port to provide a low voltage level, using the supply voltage, to at least one transistor having a gate oxide that operates at the low voltage level, the low voltage level being less than the supply voltage level.

15. The method of claim 14, wherein using the impedance circuit coupled to the input port to provide a low voltage level includes clamping a gate-source voltage of the input transistor.

16. The method of claim 13, wherein providing the wake-up signal includes providing the wake-up signal at an output port of a comparator circuit connected between the power rail and the ground rail by, in response to the current flowing in the current path, passing current between the power rail and the ground rail.

17. The method of claim 13, further including, after providing the wake-up signal, transitioning back to the power-saving mode in response to the voltage level at the input port returning to the threshold voltage level.

18. The method of claim 13, further including
operating in the power-saving mode when the voltage level at the input port corresponds to the supply voltage level,
transitioning from the power-saving mode to the wake-up mode in response to the voltage at the input port transitioning toward the ground voltage level, and
transitioning back to the power-saving mode in response to the voltage level at the input port transitioning toward the supply voltage level.

19. An apparatus comprising
a bias circuit configured and arranged to generate a bias voltage by dividing a supply voltage level provided on a power rail by a battery, relative to a ground voltage level provided on a ground rail; and
a communication circuit configured and arranged to provide an output indicative of a voltage level at an input port, the communication circuit including
   an input transistor coupled between the power rail and the ground rail and having a gate coupled to the input port, and
   a voltage-limiting circuit configured and arranged to
      clamp a gate-source voltage of the transistor in response to voltage level on the input port by presenting a first voltage level to the gate, the first voltage level being drawn from the power rail and less than the voltage level on the power rail,
      operate in a power-saving mode in which current is blocked on a current path between the power rail and the ground rail and including the transistor, based on a threshold voltage level being presented at the input port, the threshold voltage corresponding to one of the supply voltage level and the ground voltage level,
      in response to the voltage level at the input port transitioning away from the threshold voltage level, transitioning from the power-saving mode to a wake-up mode in which current is no longer blocked in the current path, and
      while in the wake-up mode, provide a wake-up signal based on the voltage level at the input port and the bias voltage.

20. The apparatus of claim 19, wherein the communication circuit includes
   a current mirror circuit connected between the power rail and the ground rail and configured and arranged to flow a current that mirrors current in the current path, using the bias voltage, and
   a comparator circuit connected between the power rail and the ground rail and configured and arranged to provide the wake-up signal based on a comparison between the current flowing through the current mirror circuit and a current flowing through the comparator circuit.

* * * * *